United States Patent [19]

Byrnes et al.

[11] 4,027,935

[45] June 7, 1977

[54] CONTACT FOR AN ELECTRICAL CONTACTOR ASSEMBLY

[75] Inventors: Herbert P. Byrnes, Poughkeepsie; Richard Wahl, Fishkill, both of N.Y.

[73] Assignee: International Business Machines Corporation, Armonk, N.Y.

[22] Filed: June 21, 1976

[21] Appl. No.: 697,812

[52] U.S. Cl. .............................. 339/48; 339/17 M; 339/95 R
[51] Int. Cl.² ......................................... H01R 9/12
[58] Field of Search ........ 339/17, 48, 49 B, 75 MP, 339/95

[56] References Cited
UNITED STATES PATENTS

| 2,965,811 | 12/1960 | Batcher | 339/17 M |
| 3,957,334 | 5/1976 | Pass et al. | 339/75 MP |

OTHER PUBLICATIONS

IBM Bulletin, Bruder et al., Dual Buckling Beam, 7/1974, pp. 638 & 639, vol. 17, No. 2.

*Primary Examiner*—Joseph H. McGlynn
*Attorney, Agent, or Firm*—Harold H. Sweeney, Jr.

[57] ABSTRACT

A contact for a contactor assembly is provided which is short enough for use in high frequency applications and which has a pivotable end and a pre-curved center section which deflects in combination with the pivoting of the pivotable end to provide minimal forces on contact pads when a force is applied between the pad and the contactor assembly. The pre-curved center section has a large radius and is arranged such that the pivotable end and the contacting end of the contact are offset from one another within the plane including the radius of the center section so that the deflection direction is predetermined and deflection forces are reduced.

8 Claims, 6 Drawing Figures

CONTACT FOR AN ELECTRICAL CONTACTOR ASSEMBLY

BACKGROUND OF THE INVENTION

Statement of the Invention

The invention relates to a contact for a contactor assembly, and more particularly, to a contact which has a short length suitable for high frequency applications and which applies a minimal force to electrical contact pads on products being tested or connected thereto.

Description of the Prior Art

In U.S. Pat. No. 3,806,801, filed Dec. 26, 1972 and issued Apr. 23, 1974, a contactor assembly having what are called buckling beam probes or contacts is disclosed in which the probe contactor has each of it's probes formed with a length many times it's cross-sectional area so that the probes buckle or deflect when a predetermined axial load is applied thereto. This enables the same force to be exerted on each of a plurality of pads on a semiconductor chip regardless of the deflection of the probes produced by variations in the heights of the pads. The forces for contacting the pad must be kept small so that the pads are not damaged. Accordingly, this prior art contact or probe was made sufficiently long with respect to it's cross-sectional area such that the force applied to the pads would be determined by the resistance to buckling of the beam. The long buckling beam provides a small force plus a relatively uniform force throughout it's deflection or buckling range. This prior art probe was contained at the upper end and was free to move only vertically at the lower end and was constrained to buckle in a given direction by an upper and lower die member. These long contacts were not adaptable to high-frequency operations because of their length. Shortening the contact or probe increased the force applied to the pads thereby increasing the amount of pad damage.

Accordingly, it is the main object of the present invention to provide a short contact for a contactor assembly which is operable in high frequency applications and which provides minimal forces on connector pads.

It is a further object of the present invention to provide a contact for a contactor assembly which includes a pivoting and deflection operation combination to produce minimal contacting forces.

It is another object of the present invention to provide a contact for a contactor assembly in which the pre-curved central portion is flattened to produce a deflection characteristic having less deflection resistance.

It is yet another object of the present invention to provide a contactor for a contact assembly in which the ends thereof are offset from one another within the plane including the radius of curvature of the central section so that the deflection direction is essentially predetermined and radial pivoting is absolutely minimized which also contributes to high frequency electrical conformity and permits utilization on very close centers.

Another object of the present invention is to provide pivotal contact wipe at the interface between the balled upper end of the contact and the associated electrical conductive elements.

Another object of this invention is to provide minimal controlled contact wipe at the interface area between the lower end of the contact and the electrical pad on the product being tested due to essentially linear motion of this contact end.

SUMMARY OF THE INVENTION

A plurality of short electrically conductive contacts made of thin spring wire are provided each arranged in the contactor assembly to extend between a first and second connector pad when the second connector pad contacts the contacts of the assembly. The upper end of the contact is formed for pivoting in an upper die, thereby making wiping contact with the respective first connector pads. A substantially straight short-neck section extends away from the pivotable end towards the second pad. A curved central section extends from the end of the neck towards the second pad with a large radius such that the ends thereof are offset with respect to one another in the plane including the radius of the center section. A short straight end section extends from the other end of the curved central section towards the second connector pad slidably through a lower die and has the end thereof adapted for contacting the second connector pad. The curved center section of the contactor deflects and the pivotable end thereof correspondingly pivots when the second connector pads apply force to the contacts thereby applying a minimal pressure to the second connector pads.

The foregoing and other objects, features and advantages of the invention will be apparent from the following more particular description of preferred embodiments of the invention as illustrated in the accompanying drawings.

DESCRIPTION OF THE PREFERRED EMBODIMENT

Figure 1:
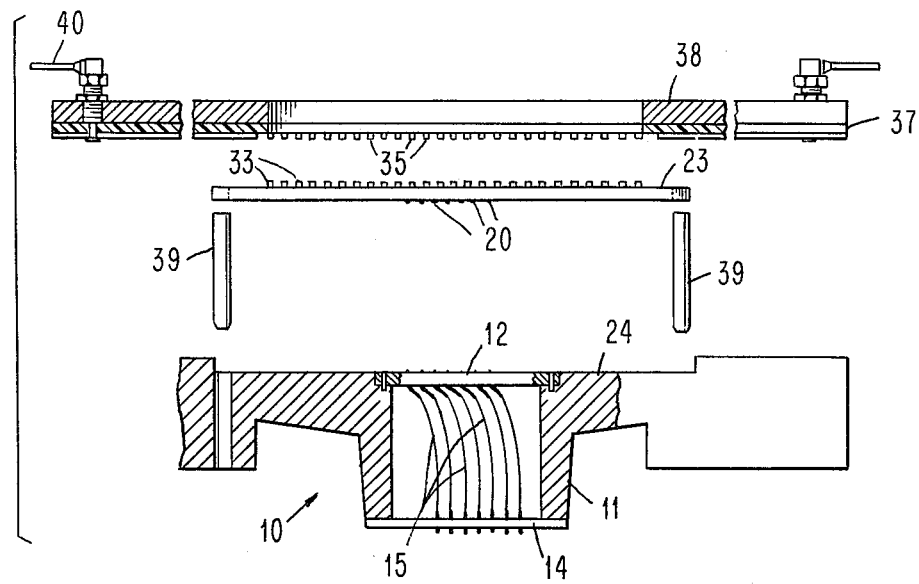
FIG. 1 is a schematic exploded elevational view, partly in section, showing the contactor assembly of the present invention.

Referring to FIG. 1 there is shown a contactor assembly 10 in which the improved contacts of the present invention are utilized. The contactor assembly 10 includes a housing 11 which supports a upper and lower alignment die 12 and 14.

The contactor assembly 10 includes a plurality of contacts 15 made of electrically conductive wire which is pivotably supported in the upper alignment die 12 and extends through openings in the lower alignment die 14. These lower alignment die openings are sufficiently large that the contacts 15 are free to vertically slide therein when an axial load is applied to the end of the contacts 15 extending below the die 14 but sufficiently small to prevent undesired motion or wipe at the contacting area.

The contacts 15 have a balled or swaged upper end 17 formed thereon which fits into the opening 19 of the upper die 12 so as to be free to pivot therein. It should be appreciated, that the pivotable end 17 of the contact 15 can be in the form of a cylinder with the cylindrical surfaces arranged such that the contact 15 can pivot when it is deflected as represented by the dotted line deflection positions 20 shown in FIG. 2. A variety of other shapes can be utilized at the upper end of the contact as long as the contact is free to pivot about that end. Another constraint on the pivotably formed end 17 of the contact 15 is that a surface of the pivotable end extends slightly above the top of the upper die 12 so that it contacts one of the electrical conductive elements 20 which are located usually in a multi-layered ceramic substrate 23, which is supported on a support flange 24 of the housing 11.

Dowel pins 39 are utilized to align the upper ends of the contacts 15 with the conductive elements 20 by aligning the housing 11 and the substrate 23.

Each of the conductive elements 20 are electrically connected through the substrate 23 to a conductive pad 33 on the upper surface of substrate 23. The pads 33 are arranged in a desired pattern so that each of the pads 33 will engage a contact 35 on a printed circuit board 37 when the substrate 23 is disposed between the housing 11 and the printed circuit board 37.

The printed circuit board 37 is bonded to an aluminum plate 38. Each of the contacts 35 extends from the edge of the inner surface of the printed circuit board 37 to the outer surface thereof. Each contact 35 makes contact with an electrical conductor 40, which is mounted to the aluminum plate 38. Accordingly, the aluminum plate 38 has the same number of electrical conductors 40 mounted thereto as the number of the contacts 35 on the printed circuit board 37 and the number of the contacts 15 within housing 11.

Accordingly, electrical power can be supplied from a tester through each of the conductors 40 to the connected contact 35 of the printed circuit board 37 and then through the element 20 of the substrate 23 to the contact 15. Thus, each of the contactors 15 can be selectively powered as desired.

Figure 2:
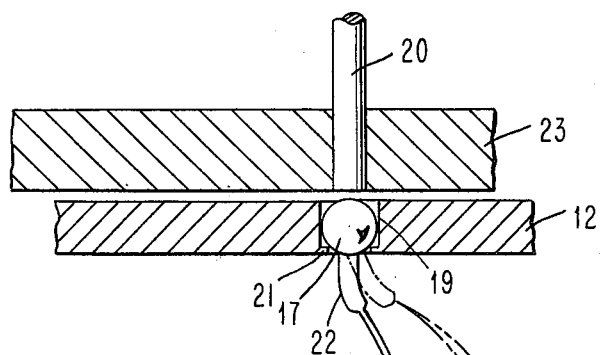
FIG. 2 is an amplified view of one of the contacts in the assembly and illustrating the pivot and deflection characteristics thereof.

As can be seen in FIG. 2, the pivotable end of the contact 15 is supported at 21 in the upper die 12 to prevent the contact from dropping out of the die 14. The only constraint on the upper die 12 is that it have sufficient clearance at the bottom of the openings 19 therein such that the neck or straight extension portion 22 of the contact 15 extending from the pivotably formed end 17 is not restrained so that required pivoting can take place as the contacts 15 deflect. In order for the contacts to properly deflect, it is necessary that the bottom section 25 of the contact 15 be free to slide in the opening 27 provided in the lower die 14. It can be seen, that as the electrical pad 29 on the product being tested or connected thereto is pushed against the bottom end of the contact 15 the force is transformed to motion of the contact 15 through the lower die 14 and corresponding flexing of the central precurved portion 31 of the contact takes place. As the deflection takes place, pivoting also takes place at the upper end of the contact 15. As can be seen in FIG. 2, the contact 15 has a central portion 31 therein which has a predetermined curvature built therein. This predetermined curvature has a large radius and is arranged such that the top of the curved central portion 31 is offset from the bottom end of the curved central portion in a plane which contains the radius of the curved central section of the contact. Accordingly the upper and lower section of the contact are likewise offset with respect to one another. The openings 19 in die 12 are likewise offset from the openings 27 in the lower die 14. This offset causes the deflection of all the contacts 15 to take place in a predetermined direction, thus preventing shorting contact with one another and minimizing any radial pivoting which also contributes to the high frequency electrical uniformity and permits utilization on very close centers.

Figure 3:
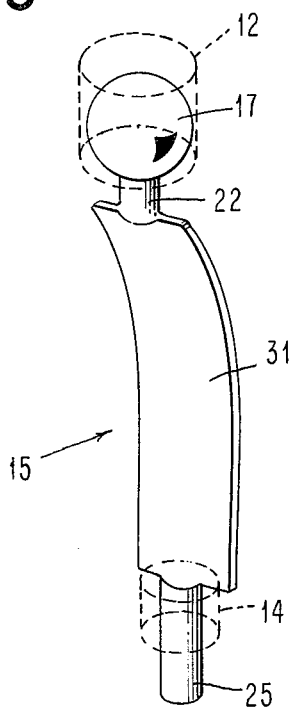
FIG. 3 is a schematic diagram showing a short contact having a flattened curved center section.
Figure 4:
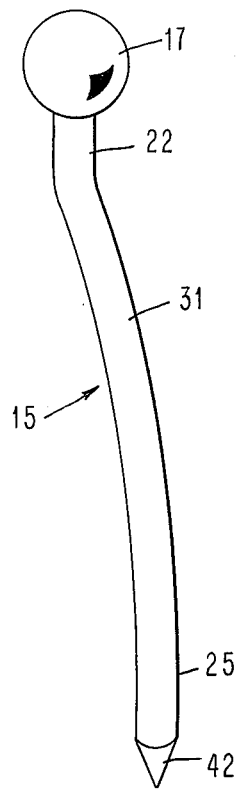
FIG. 4 is a schematic diagram showing a contact made of a small diameter wire.

FIGS. 3 and 4 show two slightly different versions of the contact respectively. FIG. 3 shows the contact having a flattened central section 31 which provides an improved deflection characteristic since it reduces the resistance to deflection and correspondingly reduces the forces applied to the product pad 29. Actually, the flattening of the curved center section 31 of the contact 15, since it further minimizes the forces applied to the electrical pads on the product, allows the contact 15 to be made even shorter, as can be noted in comparison with the contact of FIG. 4, and still apply a force to the product pad which is within the acceptable force range. The bottom of the flattened curved section 31 of the contact is wider than the opening in die 14 through which the bottom end section 25 passes thereby forming a shoulder which prevents vertical droppingout of the contact from the dies.

The contact shown in FIG. 4 is made from a section of small diameter spring wire which is preformed to have the desired curvature for the center portion 31 of the contact. It should be noted that the bottom section 25 of the contact is shown having a pointed end 42 for possible better electrical contact with the product pad 29.

Figure 5:
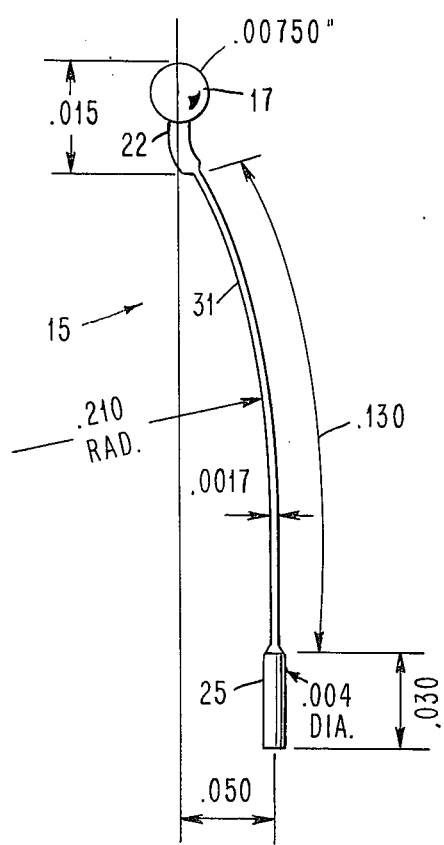
FIG. 5 is a schematic diagram of a contact showing the various dimensions and radii thereon.
Figure 6:
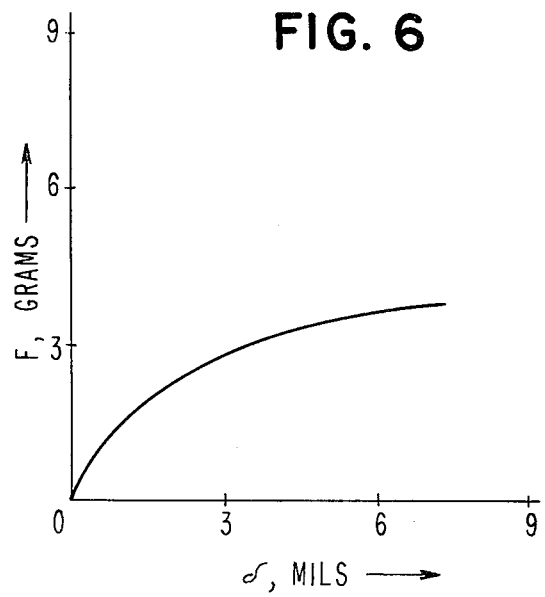
FIG. 6 is a graph of the force in grams applied to the contact and the deflection in mils that results therein.

Referring to FIG. 5, there is shown a representation, not to scale, of a contact 15 utilized in the contactor assembly 10 of this invention with the various typical dimensions shown thereon. The contact is made of wire having 0.004 inch diameter. The upper end of the contact is shown as a ball 17 having a diameter of 0.0075 inch. The neck portion 22 extending from the bottom of the balled end 17 to the top of the flattened central portion of the contact is approximately 0.015 inch long. The offset of the top of the contact 15 with respect to the other end thereof is shown as 0.050 inch. The central curved portion 31 of the contact is shown as 0.0130 inch long and has a radius of 0.210 inch. Of course, this curved central portion 31 of the contact 15 provides the offset of the upper end with respect to the lower end. This central portion 31 is flattened as mentioned previously to about 0.0017 inch in thickness. The straight non-flattened end portion 25 which slides within the opening in the lower die when pressure is applied to the end thereof by a product is typically 0.030 inch long. A graph of the force in grams vs. the displacement $\delta$ in mils is shown in FIG. 6. As would be expected, the lower forces cause a corresponding small deflection until a point is reached where a small change in force causes a large deflection change. What is happening is that a force range is reached where the force is more or less stabilized with regard to deflection variations. For example, the 3 gram force applied to the lower end of the contact causes approximately a 3 mil deflection while a 4 gram force causes approximately a 7 mil deflection. Further small increases in force cause corresponding large increases in deflection.

The contact 15 shown in the example of FIG. 5 is approximately 0.175 inch long. A short contact of this type has been found to satisfactorily operate at high frequencies. With this short contact, when utilized in a high density situation, that is, when a large number of contacts are utilized in the contact assembly, there is a minimum of cross-talk because of the short length of the contact. Also, because of the end offset of the contact, it cannot deflect in the wrong direction so as to touch other contacts, thereby shorting out with respect to each other. Thus, depending on contact proximities, there may be no need for any insulation along the lengths of the contact. It has also been found that the pre-curved and offset shaping of the contact provides very little, if any, tendency of the contact to torque or pivot about it's end out of it's predetermined path of deflection. Although particular dimensions have been given in the above example, the contact is adaptable to a multitude of lengths, deflections, and contact forces. As mentioned previously, it is adaptable to a flat or pointed end for probing, that is, contact can be made with the product pad by a pointed arrangement. The arrangement has a low spring rate at the operating point and an appreciable working deflection range. Of course, the design criteria is to achieve low contact forces with short lengths having good high frequency characteristics.

The length of the contactor assembly having a given force applied to the ends thereof or the force to be applied for a given length can be determined from the following general equation:

$$L = f\left(\frac{KEI}{Pcr}\right)^{1/2}$$

where $L$ = the length of the contact, E is the modulus of elasticity of the material of the contact, and I is the least moment of inertia of the contact, Pcr is an axial load on the end of the contact which causes buckling thereof, and K is a constant depending on particular conditions.

The foregoing and other objects, features and advantages of the invention will be apparent from the following more particular description of a preferred embodiment of the invention as illustrated in the accompanying drawings.

What is claimed:

1. In an electrical contactor assembly for making electrical connections to a plurality of closely spaced pads on a product such as a chip simultaneously;
   a plurality of short, electrically conductive contacts made of thin spring wire each arranged in said assembly to extend between a first and second connector pad when the second connector pads contact the contacts of said assembly;
   means for pivoting in an upper die formed on a first end of each of said contacts so as to make wiping contact with said respective first connector pads;
   a substantially straight short neck section extending away from said means for pivioting toward said second pad;
   a curved central section extending from the end of said neck towards said second pad with a large radius such that the ends thereof are offset with respect to one another in the plane containing said radius;
   a short straight end section extending from the other end of said curved central section toward said second connector pads through a lower die and having the end thereof adapted for contacting the second connector pad;
   said curved center section of said contacts deflecting in the plane containing said radius and said pivot means pivoting when said second connector pads apply force to the contacts, thereby applying a minimal pressure to said second connector pads and maintaining high frequency electrical uniformity.

2. In an electrical contactor assembly according to claim 1, wherein said means for pivoting in an upper die formed on a first end of each of said contactors is an electrically conductive contact ball.

3. In an electrical contactor assembly according to claim 1, wherein said means for pivoting in an upper die formed on a first end of each of said contacts is an electrically conductive cylinder having the cylindrical surfaces located in said upper die so that the pivoting is only in the direction of deflection of said curved center portion of said contact.

4. In an electrical contactor assembly according to claim 1, wherein said curved central section of said conductive spring wire contact is flattened to give a wider thinner central section having smaller deflection resistance.

5. In an electrical contactor assembly according to claim 1, wherein said means for pivoting in an upper die includes an opening through the die laterally restraining the pivoting means therein, said opening providing at the bottom thereof sufficient clearance for said contact so as to allow sufficient pivoting for the deflection range of said contact.

6. In an electrical contactor assembly according to claim 1, wherein said means for pivoting extends above the upper die so as to provide wiping contact with said respective first connector pads.

7. In an electrical contactor assembly according to claim 1, wherein the contact length and the force applied thereto for a contact having said pivoting means at one end thereof and the force applied axially to the other end thereof is expressed by the relationship:

$$L = f\left(\frac{KEI}{Pcr}\right)^{1/2}$$

where $L$ = contact length, E = modulus of elasticity of the contact material, I = the least moment of inertia, Pcr = the predetermined axial load to be provided to said contact to cause deflection thereof and $K$ = a constant.

8. In an electrical contactor assembly according to claim 4, wherein said flattened, curved central section of said contact forms at the bottom thereof a shoulder which is wider than the diameter of the opening in said bottom die thereby providing a stop to maintain the vertical captivity of said contact with respect to said contactor.

* * * * *